(12) United States Patent
Yoshimoto et al.

(10) Patent No.: US 8,313,888 B2
(45) Date of Patent: *Nov. 20, 2012

(54) PHOTOSENSITIVE FLEXOGRAPHIC PRINTING ORIGINAL PLATE

(75) Inventors: Kazuya Yoshimoto, Okayama (JP); Tetsuma Kawakami, Okayama (JP); Yasuyuki Munekuni, Okayama (JP); Keiichi Motoi, Okayama (JP); Yukimi Yawata, Okayama (JP); Toru Wada, Okayama (JP)

(73) Assignee: Toyo Boseki Kabushiki Kaisha, Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/600,937

(22) PCT Filed: Dec. 5, 2008

(86) PCT No.: PCT/JP2008/003613
§ 371 (c)(1),
(2), (4) Date: Nov. 19, 2009

(87) PCT Pub. No.: WO2009/150703
PCT Pub. Date: Dec. 17, 2009

(65) Prior Publication Data
US 2010/0167202 A1 Jul. 1, 2010

(30) Foreign Application Priority Data

Jun. 11, 2008 (JP) .................................. 2008-152884

(51) Int. Cl.
G03C 1/00 (2006.01)
G03F 7/00 (2006.01)

(52) U.S. Cl. ............... 430/283.1; 430/270.1; 430/273.1; 430/281.1

(58) Field of Classification Search ............... 430/270.1, 430/306
See application file for complete search history.

(56) References Cited

U.S. PATENT DOCUMENTS

| | | | |
|---|---|---|---|
| 3,954,472 | A | 5/1976 | Walls |
| 4,132,168 | A | 1/1979 | Peterson |
| 4,214,965 | A | 7/1980 | Rowe |
| 4,323,637 | A | 4/1982 | Chen et al. |
| 4,430,366 | A | 2/1984 | Crawford et al. |
| 4,883,742 | A | 11/1989 | Wallbillitch et al. |
| 5,171,650 | A | 12/1992 | Ellis et al. |
| 5,308,737 | A | 5/1994 | Bills et al. |
| 5,379,698 | A | 1/1995 | Nowak et al. |
| RE35,512 | E | 5/1997 | Nowak et al. |
| 5,719,009 | A * | 2/1998 | Fan ................. 430/306 |
| 5,776,654 | A | 7/1998 | Vermeersch et al. |
| 6,238,837 | B1 | 5/2001 | Fan |
| 6,245,486 | B1 * | 6/2001 | Teng ............... 430/303 |
| 6,367,381 | B1 * | 4/2002 | Kanga ............ 101/395 |
| 7,070,906 | B2 | 7/2006 | Wada et al. |
| 7,097,957 | B2 | 8/2006 | Wada et al. |
| 7,205,092 | B2 * | 4/2007 | Ichikawa et al. ......... 430/273.1 |
| 2001/0038975 | A1 | 11/2001 | Daems et al. |
| 2003/0082482 | A1 * | 5/2003 | Wada et al. .............. 430/273.1 |
| 2008/0305407 | A1 * | 12/2008 | Zwadlo et al. .............. 430/5 |
| 2010/0093119 | A1 * | 4/2010 | Shimizu ................ 438/29 |

FOREIGN PATENT DOCUMENTS

| | | |
|---|---|---|
| EP | 0 741 330 | 11/1996 |
| EP | 1 146 392 | 10/2001 |
| EP | 1 382 446 | 1/2004 |
| JP | 7-506201 | 7/1995 |
| JP | 7-509789 | 10/1995 |
| JP | 8-305030 | 11/1996 |
| JP | 9-171247 | 6/1997 |
| JP | 2001-260551 | 9/2001 |
| JP | 2001-324815 | 11/2001 |
| JP | 2002-014460 | 1/2002 |
| JP | 2002-214792 | 7/2002 |
| JP | 2002-357907 | 12/2002 |
| JP | 2003-035954 | 2/2003 |
| JP | 2009058901 A * | 3/2009 |
| WO | WO-94/03838 | 2/1994 |
| WO | WO-94/03839 | 2/1994 |
| WO | WO-01/63364 | 8/2001 |
| WO | WO-2006/095472 | 9/2006 |

OTHER PUBLICATIONS

Cognis, www.cognis.com 2009.*
Japanese Office Action mailed Jul. 31, 2008, directed to counterpart application No. 2008-152884; 4 pages.
International Search Report mailed Jan. 6, 2009, directed to counterpart application PCT/JP2008/003613; 2 pages.
EP Search Report dated Nov. 7, 2005, directed to EP Patent Application No. 04014285.3; 3 pages.

* cited by examiner

*Primary Examiner* — Cynthia Kelly
*Assistant Examiner* — Chanceity Robinson
(74) *Attorney, Agent, or Firm* — Morrison & Foerster LLP

(57) ABSTRACT

The present invention provides a photosensitive flexographic printing original plate provided with a heat sensitive mask layer having high light blocking effect and durability yet prepared as a thin film. A photosensitive flexographic printing original plate including at least (A) a supporting member, (B) a photosensitive resin layer, (C) a protective layer and (D) a heat sensitive mask layer that are successively laminated, wherein the heat sensitive mask layer (D) contains carbon black and, as a dispersion binder therefor, a butyral resin as well as polyamide containing polar group selected from the group consisting of polyamide containing a tertiary amine group, polyamide containing a quaternary ammonium salt group, polyamide containing an ether group and polyamide containing a sulfonic group.

3 Claims, No Drawings

PHOTOSENSITIVE FLEXOGRAPHIC PRINTING ORIGINAL PLATE

TECHNICAL FIELD OF THE INVENTION

This invention relates to a photosensitive flexographic printing original plate to be used for producing a flexographic printing plate according to a Computer to Plate Technique, and in particular, it concerns a photosensitive flexographic printing original plate provided with a heat sensitive mask layer having high light blocking effect and durability even if prepared as a thin film.

BACKGROUND ART

In recent years, in the field of flexographic printing, a Computer to Plate Technique (CTP Technique), known as a digital image-forming technique, has been widely used as a general technique. The CTP technique is a method in which information processed on a computer is directly outputted onto a printing plate so that a concave/convex pattern to form a relief is obtained. This technique eliminates the necessity of negative film producing processes, thereby making it possible to reduce costs and time required for forming the negative film.

In the CTP technique, the negative film, conventionally used so as to cover areas that should not be polymerized, is replaced by a mask that is formed and integrated within a printing plate. With respect to the method for obtaining the integration mask, a method has been widely used in which an infra-red ray sensitive layer (a heat sensitive mask layer) that is opaque to chemical rays is formed on a photosensitive resin layer and by evaporating this infra-red ray sensitive layer by using an infrared laser, an image mask is formed (cf. Japanese Patent Application Republication No. 506201/95).

As the heat sensitive mask layer, those layers, made from carbon black serving as an opaque material to radiations and a binder, are generally used. The heat sensitive mask layer is subjected to abrasion by an infrared laser. Therefore, the layer is desirably made thinner from the viewpoint of abrasion efficiency. Here, as the layer is made thinner, influences of the caused wrinkles onto the relief become lesser. However, in order to prevent chemical radiations from being transmitted into a photo-polymerizable layer, the photosensitive mask layer generally needs to have a transmittance optical density (light blocking effect) of 2.0 or more. An ideal heat sensitive mask layer is such a layer as to provide a predetermined transmittance optical density (light blocking effect) or more yet prepared as a thin film.

In general, the optical density (light blocking effect) of the heat sensitive mask layer is defined by the following formula.

Optical density=$\log(100/T)=\epsilon cl$

Here, T represents a transmittance (%), c represents a density of an infra-red ray absorbing substance (mol·l$^{-1}$), l represents a thickness (cm), and $\epsilon$ represents a molecular extinction coefficient (l·mol$^{-1}$·cm$^{-1}$). As can be understood by the above-mentioned formula, the optical density can be enhanced by increasing the density of the infrared-ray absorbing material (carbon black); however, in this case, the film becomes too brittle, which causes innumerable scratches in working process. The scratched portions fail to shield light, thereby causing unnecessary images to be formed on a relief. Moreover, although the optical density can be increased by making the coat film thickness thicker; however, in this case, high energy is required to cause abrasion, and wrinkles tend to be caused on the relief. Wrinkles on the relief become in particular a serious problem in the case of a water developing plate whose photosensitive resin layer is flexible.

Here, it has been known that the light blocking effect is changed depending on the dispersing state of carbon black even when the carbon black density and the layer thickness are the same. In general, the better the dispersing state, the higher the optical density becomes. Here, the dispersing state of carbon black is highly influenced by a binder resin.

Up to now, as the binder resin for the heat sensitive mask layer, a nylon resin (cf. Japanese Patent Application Laid-Open (JP-A) No. 305030/96), a polyvinyl alcohol resin (cf. Japanese Patent Application Laid-Open (JP-A) No. 171247/97), a heat decomposable polymer (cf. Japanese Patent Application Laid-Open (JP-A) No. 2002-214792) or a plurality of polymers have been used. In the case where the nylon resin is used, although the durability of the heat sensitive mask layer becomes superior, the dispersing state of carbon black becomes undesirable, causing the necessity of increasing the layer thickness so as to achieve a predetermined optical density. On the other hand, in the case where the polyvinyl alcohol resin is used, the resulting defect is that the durability of the film deteriorates. In the case where the heat decomposable polymer is used as well, it is not possible to obtain a satisfactory abrasion efficiency. Therefore, at present, a heat sensitive mask layer having a high optical density (light blocking effect) with superior durability yet prepared as a thin film has not been achieved.

DISCLOSURE OF THE INVENTION

Problem that the Invention is to Solve

The present invention has been devised so as to solve the problems with the conventional art, and its objective is to provide a flexographic printing original plate having a heat sensitive mask layer that has high light blocking effect and durability yet prepared as a thin film.

Means for Solving the Problem

As a result of intensive studies made to achieve the above-mentioned objective, the inventors consequently have noted that, by using a butyral resin and polyamide containing polar group as a binder for improving the dispersion property for carbon black of a heat sensitive mask layer, desired effects can be obtained, thereby completing the present invention.

That is, the present invention relates to a photosensitive flexographic printing original plate including at least (A) a supporting member, (B) a photosensitive resin layer, (C) a protective layer and (D) a heat sensitive mask layer that are successively laminated, wherein the heat sensitive mask layer (D) contains carbon black and, as a dispersion binder therefor, a butyral resin as well as polyamide containing polar group selected from the group consisting of polyamide containing a tertiary amine group, polyamide containing a quaternary ammonium salt group, polyamide containing an ether group and polyamide containing a sulfonic group.

In one preferable mode of the photosensitive flexographic printing original plate of the present invention, the butyral resin and the polyamide containing polar group have a weight ratio in a range from 20 to 80:20 to 80, and the carbon black and dispersion binder have a weight ratio in a range from 25 to 50:20 to 75.

Advantages of the Invention

The photosensitive flexographic printing original plate of the present invention makes it possible to improve the dispersing property of carbon black by using a butyral resin as a dispersion binder for carbon black of the heat sensitive mask layer and also to enhance the durability as well as improving the dispersing property due to the polar group by using polyamide containing polar group as a binder for carbon black. Therefore, the present invention makes it possible to achieve a high light blocking effect by using the heat sensitive mask layer with a thin thickness, and consequently to provide a photosensitive flexographic printing original plate that can be subjected to abrasion at low energy, and is less vulnerable to wrinkles on the relief.

BEST MODE FOR CARRYING OUT THE INVENTION

The photosensitive flexographic printing original plate of the present invention will now be illustrated in detail as follows.

The photosensitive flexographic printing original plate of the present invention has a constitution in which at least (A) a supporting member, (B) a photosensitive resin layer, (C) a protective layer and (D) a heat sensitive mask layer are successively laminated.

The supporting member (A) to be used for the original plate of the present invention is flexible, and preferably made from a material having a superior dimension stability, and examples thereof include: a supporting member made of metal, such as steel, aluminum, copper and nickel, and a supporting member made of a thermoplastic resin, such as a polyethylene terephthalate film, a polyethylene naphthalate film, a polybutylene terephthalate film and a polycarbonate film. Among these, the polyethylene terephthalate film, which has a superior dimension stability and a sufficiently high viscoelasticity, is in particular preferably used. The thickness of the supporting member is set to 50 to 350 µm, preferably, to 100 to 254 µm, from the viewpoints of mechanical properties, shape stability and handling characteristics upon producing a printing plate. Moreover, if necessary, in order to improve an adhesive property between the supporting member and a photosensitive resin layer, an adhesive may be formed between them.

The photosensitive resin layer (B) to be used for the original plate of the present invention is composed of essential components, such as a synthetic polymer compound, a photopolymerizable unsaturated compound and a photopolymerization initiator, and desirable additives, such as a plasticizer, a thermal polymerization inhibitor, a dye, a pigment, an ultraviolet-ray absorbing agent, perfume, and an antioxidant. The photosensitive resin layer (B) may be the one which is developable by using a water-based developer, or may be the one which is developable by using an organic solvent. Latex is preferably used as the synthetic polymer compound that can be developed by a water-based developer.

Examples of the latex that are applicable include: water dispersible latex polymers, such as polybutadiene latex, natural rubber latex, styrene-butadiene copolymer latex, acrylonitrile-butadiene copolymer latex, polychloroprene latex, polyisoprene latex, polyurethane latex, methylmethacrylate-butadiene copolymer latex, vinylpyridine polymer latex, butyl polymer latex, thiokol polymer latex and acrylate polymer latex, and polymers obtained by copolymerizing another component, such as acrylic acid and methacrylic acid, therewith. Among these, water dispersible latex polymers having a butadiene skeleton or an isoprene skeleton in molecular chains are preferably used from the viewpoints of hardness and rubber elasticity. More specifically, polybutadiene latex, styrene-butadiene copolymer latex, acrylonitrile-butadiene copolymer latex, methylmethacrylate-butadiene copolymer latex and polyisoprene latex are preferably used. The latex needs to be designed so that its existence is confirmed as independent fine particles.

The protective layer (C) to be used for the original plate of the present invention is placed so as to prevent substance transfers between the photosensitive resin layer and the heat sensitive mask layer and so as to prevent inhibition of polymerization due to oxygen contained in the photosensitive resin layer. Not particularly limited, the protective layer (C) may be formed by using any polymers that are soluble to water or insoluble to water. Examples of polymers forming the protective layer (C) include water soluble polyamide, polyvinyl alcohol, polyacrylic acid, polyethylene oxide, alkyl cellulose, cellulose-based polymer (in particular, hydroxypropyl cellulose, hydroxyethyl cellulose and nitrocellulose), cellulose acetate butyrate, polybutyral, butyl rubber, NBR rubber, acrylic rubber, styrene-butadiene rubber, latex and soluble polyesters. Not particularly limited to one kind, two or more kinds of these polymers may be combined with one another and used. Those protective layers (C) having a thermal decomposing temperature that is higher than that of the heat sensitive mask layer are preferably used. When the thermal decomposing temperature of the protective layer is lower than that of the heat sensitive mask layer, upon abrasion of the heat sensitive mask layer, the protective layer might also be thermally decomposed.

The layer thickness of the protective layer is preferably set to 0.2 µm to 3.0 µm, more preferably, to 0.2 µm to 1.5 µm. When the layer thickness becomes less than the above-mentioned lower limit value, its oxygen barrier property becomes insufficient, resulting in a fear that roughness might occur on the relief printing plate. The layer thickness exceeding the upper limit value might cause defective reproducibility of fine lines.

The heat sensitive mask layer (D) to be used for the original plate of the present invention is composed of carbon black that is a material having a function for absorbing infrared laser rays to convert them into heat and a function for blocking ultraviolet rays, and a dispersion binder used for the carbon black. Moreover, desired components except for these, such as a pigment dispersant, a filler, a detergent or a painting aid, may be contained therein within such a range as not to impair the effects of the present invention.

The present invention is characterized in that a butyral resin and polyamide containing polar group are used in combination as a dispersion binder for carbon black. The butyral resin can improve the dispersing property of the carbon black and contribute to high light blocking effect; however, the use of the butyral resin alone makes the coat film of the heat sensitive mask layer brittle to cause deterioration of durability. Therefore, in order to maintain the durability, the present invention uses the polyamide containing polar group. The polyamide containing polar group is superior in the dispersing property of carbon black because of the effect of the polar group contained therein, and causes no deterioration of the dispersing property even when one portion of the butyral resin is replaced by this. Here, both of the butyral resin and the polyamide containing polar group are dissolved in alcohol and water; therefore, when these are concomitantly used as dispersion binders, it becomes possible to easily produce a heat sensitive mask layer that is superior in handling upon forming a film as well as in developing property by a solvent and water. Since the heat sensitive mask layer, made of the butyral resin and the polyamide containing polar group, is easily dissolved in water, it is in particular preferably used as a heat sensitive mask layer for water developing plates.

The butyral resin to be used for a dispersion binder is also referred to as polyvinyl butyral, and one kind of polyvinyl acetal produced by allowing polyvinyl alcohol and butyl aldehyde to react with each other by using an acid catalyst.

The polyamide containing polar group to be used as the dispersion binder is selected from the group consisting of polyamide containing a tertiary amine group, polyamide containing a quaternary ammonium salt group, polyamide containing an ether group and polyamide containing a sulfonic group.

The weight ratio of the butyral resin and the polyamide containing polar group in the dispersion binder of the heat sensitive mask (D) is preferably set in a range from 20 to 80:20 to 80. When the weight ratio of the two components is not within the above-mentioned range, there is a fear that the dispersing property of carbon black and the durability of the coat film of the heat sensitive mask layer might not be achieved in a well-balanced manner.

The weight ratio of the carbon black and the dispersion binder in the heat sensitive mask layer (D) is preferably set in a range from 25 to 50:20 to 75. When the weight ratio of the two components is not within the above-mentioned range, there is a fear that the light blocking effect due to carbon black might not be achieved when the heat sensitive mask layer is applied as a thin film.

The heat sensitive mask layer (D) is preferably, designed to have an optical density of 2.0 or more, more preferably, an optical density of 2.0 to 3.0, and most preferably, an optical density of 2.2 to 2.5, relative to chemical rays.

The layer thickness of the heat sensitive layer (D) is preferably set to 0.5 to 2.4 μm, more preferably, to 1.0 to 2.0 μm. When the layer thickness is set to the above-mentioned lower limit or more, it is possible to obtain an optical density of not less than a predetermined value, without the necessity of a high coating technique. Moreover, when the layer thickness is set to the above-mentioned upper limit or less, high energy is not required for evaporation of the heat sensitive mask layer, thereby making it possible to provide an advantageous method from the viewpoint of costs.

It is preferable to install a peelable le flexible cover film on the heat sensitive mask layer (D) to protect the printing original plate. Examples of the preferable peelable flexible cover film include a polyethylene terephthalate film, a polyethylene naphthalate film and a polybutylene terephthalate film. However, such a protective film is not absolutely necessary.

Although the method for manufacturing a flexographic printing original plate of the present invention is not particularly limited, it is generally manufactured by using the following processes:

First, components of the heat sensitive mask layer, such as a binder, except for carbon black are dissolved in an appropriate solvent, and carbon black is dispersed therein to prepare a dispersion solution. Next, this dispersion solution is applied to a supporting member (for example, a PET film) for a heat sensitive mask layer, and the solvent is evaporated. Thereafter, protective layer components are applied thereon so that one of laminated bodies is formed. In the meantime, in a separated manner from this, a photosensitive resin layer is formed on a supporting member by a coating process so that the other laminated body is prepared. The two laminated bodies, thus obtained, are laminated under pressure and/or a heating process so that the photosensitive resin layer is arranged adjacent to the protective layer. Here, the supporting member for the heat sensitive mask layer functions as a surface protective film after completion of the printing original plate.

When the protective film is present, a method for manufacturing a printing plate from the printing original plate of the present invention includes processes in which, first, the protective film is removed from the photosensitive printing original plate. Thereafter, the heat sensitive mask layer is imagewise-irradiated with an IR laser so that a mask is formed on the photosensitive resin layer. Preferable examples of the IR laser include an ND/YAG laser (1064 nm) and a diode laser (for example, 830 nm). A laser system desirably used for the Computer to Plate Technique is commercially available, and, for example, a CDI Spark (made by Esko-Graphics Co., Ltd.) may be used. This laser system includes a rotation cylinder drum used for holding a printing original plate, an IR laser irradiating device and a layout computer, and image information is directly transferred from the layout computer to the laser device.

After the image information has been written in the heat sensitive mask layer, active light rays are applied onto the entire surface of the photosensitive printing original plate through the mask. This process may be carried out with the plate attached to the laser cylinder; however, a method is generally used in which, after the plate has been removed from the laser device, the irradiation process is carried out by using a commonly-used irradiation unit having a flat plate shape because this method is more advantageous in that even a plate size out of the standard can be appropriately handled. Examples of the active light rays include: ultraviolet rays having a wavelength in a range from 150 to 500 nm, in particular, from 300 to 400 nm. Examples of its light source include: a low-pressure mercury lamp, a high-pressure mercury lamp, a super-high-pressure mercury lamp, a metal halide lamp, a xenon lamp, a zirconium lamp, a carbon arc lamp and an ultraviolet-ray fluorescent lamp. Thereafter, the irradiated plate is developed so that a printing plate is obtained. The developing process can be carried out by using a commonly-used developing unit.

EXAMPLES

The present invention will now be specifically illustrated by way of the following Examples although the present invention is not limited thereto.

Preparation of the Dispersion Binder

As the dispersion binder, a butyral resin, polyamide containing a tertiary amine group, polyamide containing an ether group, polyamide containing a quaternary ammonium salt group, polyamide containing a sulfonic group, polyamide containing no polar group and polyvinyl alcohol were prepared. BM-5 made by Sekisui Chemical Co., Ltd. was used as the butyral resin. With respect to polyamide containing a tertiary amine group, the polyamide containing an ether group, the polyamide containing a quaternary ammonium salt group and the polyamide containing a sulfonic group, those materials synthesized as described below were used. Macromelt 6900 made by Henkel Japan Ltd. was used as the polyamide containing no polar group. A GH23 made by Nippon Synthetic Chemical Industry Co., Ltd was used as polyvinyl alcohol.

Synthesis of the Polyamide Containing a Tertiary Amine Group

Into an autoclave were loaded ε-caprolactam (50 parts by weight), N,N-di(γ-aminopropyl) piperazine adipate (40 parts by weight), 3-bis-aminomethyl cyclohexane adipate (10 parts by weight) and water (100 parts by weight), and after having been substituted with nitrogen, the autoclave was tightly closed and gradually heated. From the time when the inner pressure had reached 10 kg/m³, the water was distilled off until the pressure was no longer maintained, and this was returned to normal pressure in about 2 hours, and then allowed to react with one another at normal pressure for one hour. The maximum polymerization reaction temperature was 255° C. By these processes, polyamide containing a tertiary amine group having a melting point of 137° C. with a specific viscosity of 1.96 was obtained.

Synthesis of the Polyamide Containing an Ether Group

Acrylonitrile was added to each of the two terminals of polyethylene glycol having a number-average molecular weight of 600, and this was subjected to a reduction treatment by hydrogen so that α,ω-diaminopolyoxyethylene was obtained, and an equimolar salt between this and diadipic acid (60 parts by weight), ε-caprolactam (20 parts by weight) and an equimolar salt between hexamethylene diamine and adipic acid (20 parts by weight) were fused and polymerized so that polyamide containing an ether group having a relative viscosity of 2.50 (viscosity obtained by measuring at 25° C. a solution prepared by dissolving 1 g of the polymer in 100 ml of water chloral) was obtained.

Synthesis of the Polyamide Containing a Quaternary Ammonium Salt Group

The polyamide containing a tertiary amine group (100 g), synthesized as described above, was dissolved in 1000 cc of methanol. Successively, adipic acid (4.4 g) was added to this. After having been stirred at 30° C. for 3 hours, methanol was distilled off so that polyamide containing a quaternary ammonium salt group was obtained.

Synthesis of the Polyamide Containing a Sulfonic Group

Into an autoclave were loaded ε-caprolactam (4270 g), hexamethylene diammonium adipate (2990 g), dimethylisophthalate (1397 g), dimethyl 5-sodium sulfoisophthalate (1397 g), hexamethylene diamine (1253 g) and water (2500 g), and this was subjected to -polycondensation at 130° C. to 270 C. for 10 hours so that polyamide containing a sulfonic group was obtained.

solution of methanol and ethanol at a weight ratio of 70:30, in Comparative Example 4, the solvent used here was a mixed solution of n-butanol and toluene at a weight ratio of 80:20, and in Comparative Example 5, the solvent used here was water.

Formation of the Heat Sensitive Mask Layer

The heat sensitive mask layer coating solution was applied to a PET film supporting member (E5000, thickness: 100 μm, made by Toyobo Co., Ltd.) subjected to a releasing treatment on its two surfaces, by using a bar coater properly selected so as to provide a layer thickness of 1.5 μm, and this was subjected to a drying process at 120° C. for 5 minutes so that a heat sensitive mask layer was formed.

Performance Evaluations

Performances of each of the heat sensitive mask layers thus obtained were evaluated in the following manner.

Light blocking effect: The optical density of the heat sensitive mask layer formed on the PET film supporting member was measured by using a white/black transmission densitometer DM-520 (made by Dainippon Screen MFG Co., Ltd.).

Durability: The heat sensitive mask layer formed on the PET film supporting member was cut into a square piece having a size of 20 cm×20 cm, and another PET film (E5000, thickness: 100 μm, made by Toyobo Co., Ltd.) was superposed on the layer surface, and while this state is being maintained, these were rubbed against each other once in each of right and left directions without applying any force; then, scratches formed on the surface of the heat sensitive mask layer were inspected by using a 10-fold loupe.

○: No scratches

Δ: One to four scratches, each having a length of 50 μM or more, were observed.

x: Five or more scratches, each having a length of 50 μm or more, were observed.

Table 1 shows the results of these performance evaluations.

TABLE 1

The heat sensitive mask layer composition of Examples 1 to 6 and Comparative Examples 1 to 5 and the results of evaluations.

| | | | Example | | | | | | Comparative Example | | | | |
|---|---|---|---|---|---|---|---|---|---|---|---|---|---|
| | | | 1 | 2 | 3 | 4 | 5 | 6 | 1 | 2 | 3 | 4 | 5 |
| heat sensitive mask layer composition | dispersion binder | carbon black | 34 | 34 | 48 | 34 | 34 | 34 | 34 | 34 | 34 | 34 | 34 |
| | | butyral resin | 27 | 19 | 22 | 27 | 27 | 27 | | 66 | 27 | | |
| | | polyamide containing a tertiary amine group | 39 | 47 | 30 | | | | 66 | | | | |
| | | polyamide containing an ether group | | | | 39 | | | | | | | |
| | | polyamide containing a quaternary ammonium salt group | | | | | 39 | | | | | | |
| | | polyamide containing a sulfonic group | | | | | | 39 | | | | | |
| | | polyamide containing no polar group | | | | | | | | | 36 | 66 | |
| | | polyvinyl alcohol | | | | | | | | | | | 66 |
| results of evaluations | | light blocking effect | 2.4 | 2.3 | 2.8 | 2.4 | 2.4 | 2.1 | 1.7 | 2.3 | 1.6 | 1.5 | 2.3 |
| | | durability | ○ | ○ | Δ | ○ | ○ | ○ | ○ | X | ○ | ○ | X |

Preparation of the Heat Sensitive Mask Layer Coating Solution

In accordance with the composition (weight ratio) described in the heat sensitive mask layer composition of Table 1, a dispersion binder was dissolved in a solvent, and carbon black was dispersed in this solution to prepare a dispersion solution so that a heat sensitive mask layer coating solution was prepared. Here, in Examples 1 to 6 and Comparative Examples 1 to 3, the solvent used here was a mixed As clearly indicated by Table 1, in Examples 1 to 6 in which butyral resin and polyamide containing polar group were used in combination as a dispersion binder for carbon black of a heat sensitive mask layer, superior properties were obtained in both of light blocking effect and durability, although a thin film having a film thickness of 1.5 μm was used. Here, in the case of Comparative Example 3 in which a butyral resin and polyamide containing no polar group were used in combination, the light blocking effect was extremely lowered, although the durability was superior. For this reason, in the case of a printing original plate using the heat sensitive mask layer of Comparative Example 3, the layer thickness of the heat sensitive mask layer has to be made thicker so as to allow the heat sensitive mask layer to have a light blocking effect in such a level as to serve as a negative film. As a result, it becomes necessary to provide a high abrasion energy, and when the photosensitive resin layer in the printing original plate is flexible, wrinkles tend to occur on the photosensitive resin layer. Moreover, in the case of Comparative Example 2 in which a butyral resin is used alone as the dispersion binder and in the case of Comparative Example 5 in which polyvinyl alcohol is used alone as the dispersion binder, the durability is lowered although the light blocking effect is superior. Moreover, in the case of Comparative Example 1 in which polyamide containing polar group is used alone as the dispersion binder and in the case of Comparative Example 4 in which polyamide containing no polar group is used alone as the dispersion binder, the light blocking effect is lowered although the durability is superior. Therefore, in the case of a printing original plate using each of the heat sensitive mask layers of Comparative Examples 1 and 4, the layer thickness of the heat sensitive mask layer needs to be made thicker in the same manner as in the printing original plate using the heat sensitive mask layer of Comparative Example 3, resulting in problems of high abrasion energy and wrinkles on the photosensitive layer.

As indicated by the above-mentioned results, it is considered that by using a butyral resin and polyamide containing polar group in combination as a dispersion binder for carbon black of a heat sensitive mask layer, it becomes possible to obtain a printing original plate having a heat sensitive mask layer having high light blocking effect and durability yet prepared as a thin film.

INDUSTRIAL APPLICABILITY

Since the photosensitive flexographic printing original plate of the present invention has high light blocking effect and durability although it has a heat sensitive mask layer with a thin thickness, it is effectively useful, in particular, for a CTP plate that is subjected to abrasion by an infra-red laser.

The invention claimed is:

1. A photosensitive flexographic printing original plate, comprising (A) a supporting member, (B) a photosensitive resin layer, (C) a protective layer and (D) a heat sensitive mask layer that are successively laminated to form the photosensitive flexographic original printing plate,
   wherein the heat sensitive mask layer (D) contains an IR absorbent material consisting essentially of carbon black and a dispersion binder comprising a butyral resin and a polar group-containing polyamide selected from the group consisting of a polyamide containing a tertiary amine group, a polyamide containing a quaternary ammonium salt group, a polyamide containing an ether group and a polyamide containing a sulfonic group, and
   wherein the butyral resin and the polar group-containing polyamide have a weight ratio in a range from 20 to 80:20 to 80.

2. The photosensitive flexographic printing original plate according to claim 1, wherein the carbon black and dispersion binder in the heat sensitive mask layer are present in a weight ratio in a range from 25 to 50:20 to 75.

3. A photosensitive flexographic printing original plate, comprising (A) a supporting member, (B) a photosensitive resin layer, (C) a protective layer and (D) a heat sensitive mask layer that are successively laminated to form the photosensitive flexographic original printing plate,
   wherein the heat sensitive mask layer (D) contains an IR absorbent, pigment or dye consisting essentially of carbon black and a dispersion binder comprising a butyral resin and a polar group-containing polyamide selected from the group consisting of a polyamide containing a tertiary amine group, a polyamide containing a quaternary ammonium salt group, a polyamide containing an ether group and a polyamide containing a sulfonic group, and
   wherein the butyral resin and the polar group-containing polyamide have a weight ratio in a range from 20 to 80:20 to 80.

* * * * *